(12) United States Patent
Salzgeber (10) Patent No.: US 9,466,778 B2
(45) Date of Patent: Oct. 11, 2016

(54) THERMOELECTRIC GENERATOR UNIT

(75) Inventor: Kurt Salzgeber, Lassnitzhöhe (AT)

(73) Assignee: AVL List GmbH, Graz (AU)

( * ) Notice: Subject to any disclaimer, the term of this patent is extended or adjusted under 35 U.S.C. 154(b) by 1143 days.

(21) Appl. No.: 13/138,710

(22) PCT Filed: Mar. 31, 2010

(86) PCT No.: PCT/EP2010/054369
§ 371 (c)(1),
(2), (4) Date: Sep. 21, 2011

(87) PCT Pub. No.: WO2010/112571
PCT Pub. Date: Oct. 7, 2010

(65) Prior Publication Data
US 2012/0012146 A1    Jan. 19, 2012

(30) Foreign Application Priority Data

Apr. 2, 2009    (AT) .................................. A 526/2009
Jul. 9, 2009    (AT) ................................ A 1076/2009

(51) Int. Cl.
*H01L 35/30*    (2006.01)
*F01N 5/02*    (2006.01)

(52) U.S. Cl.
CPC .............. *H01L 35/30* (2013.01); *F01N 5/025* (2013.01); *Y02T 10/16* (2013.01)

(58) Field of Classification Search
CPC ....... H01L 35/30; H01L 35/06; H01L 35/00; H01L 35/32; F25B 27/02; F25B 2321/023; F28D 15/02; F28D 2021/0077; F28F 21/065; F28F 2265/26; F28F 3/083
See application file for complete search history.

(56) References Cited

U.S. PATENT DOCUMENTS

| 3,377,206 A | * | 4/1968 | Hänlein et al. ................ 136/212 |
| 3,451,858 A | | 6/1969 | Dingwall |
| 3,607,444 A | | 9/1971 | Debucs |
| 3,663,307 A | * | 5/1972 | Mole ............................. 136/204 |
| 5,031,689 A | | 7/1991 | Jones et al. |

(Continued)

FOREIGN PATENT DOCUMENTS

| CN | 86104587 | 7/1986 |
| CN | 2899273 | 5/2007 |

(Continued)

OTHER PUBLICATIONS

English Abstract of JP2007221895.

*Primary Examiner* — Marla D McConnell
(74) *Attorney, Agent, or Firm* — Dykema Gossett PLLC (57) ABSTRACT

The invention relates to a thermoelectric generator unit (1) comprising at least one thermoelectric module (2), which comprises an exhaust gas heat exchanger (3) on one side and a coolant heat exchanger (4) on the opposite side in a sandwich-like arrangement, wherein the exhaust gas heat exchanger and the coolant heat exchanger (3, 4) are designed as flat tubes, the flat sides (9, 13) of which are each connected by means of lateral wall sections (10, 20). According to the invention, side walls (15) are fastened to the lateral wall sections (10, 20) of at least the two heat exchangers (3, 4) lying on the outside, which side walls absorb the clamping forces for an even, permanent compression of the individual elements (2, 3, 4) of the thermoelectric generator unit (1). The thermoelectric module (2) is laterally sealed by means of the side walls (15) that absorb the clamping forces.

11 Claims, 6 Drawing Sheets

(56) References Cited

U.S. PATENT DOCUMENTS

| | | | |
|---|---|---|---|
| 5,584,183 A * | 12/1996 | Wright et al. ............ 62/3.7 |
| 7,024,865 B2 | 4/2006 | Tateyama et al. |
| 2003/0227143 A1* | 12/2003 | Eun ................. A63C 17/006 |
| | | | 280/11.221 |
| 2005/0172993 A1 | 8/2005 | Shimoji et al. |
| 2005/0172999 A1 | 8/2005 | Ohshiro et al. |

| | | | |
|---|---|---|---|
| 2006/0157102 A1 | 7/2006 | Nakajima et al. |

FOREIGN PATENT DOCUMENTS

| | | |
|---|---|---|
| DE | 102005051309 | 5/2007 |
| FR | 2427690 | 12/1979 |
| JP | 2007221895 | 8/2001 |

\* cited by examiner

THERMOELECTRIC GENERATOR UNIT

BACKGROUND OF THE INVENTION

1. Field of the Invention

The invention relates to a thermoelectric generator unit comprising at least one thermoelectric module, which is provided with an exhaust gas heat exchanger on one side and a coolant heat exchanger on the opposite side in sandwich-like arrangement, the exhaust gas heat exchanger and the coolant heat exchanger being designed as flat ducts whose flat sides are joined by lateral wall sections.

2. The Prior Art

Thermoelectric generators (TEGs) generating electrical energy by utilizing a temperature difference have been known for quite some time, for instance in the context of motor vehicles where the exhaust gas heat of an internal combustion engine is utilized. The thermoelectric module of such generator units consists of a series of p- and n-doped legs, which are provided with electrical contacts at the ends. The Seebeck effect is exploited, in which the temperature difference between two ends (i.e., a high-temperature section and a low-temperature section) of a piece of metal or semiconductor gives rise to a difference in electric potential.

From DE 10 2005 005 077 A1 there is known a thermoelectric generator for an internal combustion engine which is connected to an exhaust gas duct. The generator has a hot part, which is placed on the exhaust gas duct, and a cold part (coolant heat exchanger), which is connected to the cooling circuit of the internal combustion engine. The individual parts of the thermoelectric generator are placed concentrically about the exhaust gas duct and are pressed against the surface of the exhaust gas duct by single, circular, external holding elements, elastic elements being interposed between coolant heat exchanger elements and the circular holding elements in order to keep the thermoelectric generator elements pressed between the hot parts and the cold parts of the generator in such a way that relative motion between the individual components will be possible due to a difference in thermal expansion of the components. The problem thus is to find a way of uniformly pressing together an arrangement consisting of exhaust gas heat exchanger, thermoelectric module and coolant heat exchanger, thus ensuring good thermal contact while keeping stresses due to different thermal expansion of the components as small as possible to avoid damaging the components.

From DE 10 2005 051 309 A1 there has become known in this context a thermoelectric generator, which has a planar exhaust gas heat exchanger and at least two thermoelectric elements, the exhaust gas heat exchanger being placed sandwich-wise between the two thermoelectric elements. The unit is closed on the outside by two coolant heat exchangers, with the group of exhaust gas heat exchanger plus thermoelectric elements being sandwiched between the two coolant heat exchangers. The coolant heat exchangers are provided with outwardly pointing fastening tongues with pass-through openings. In addition there is provided a central bore through all elements of the generator unit; in the central bore as well as in the pass-through openings bolts with counter-nuts are provided for pressing together and fixing the individual elements. Instead of screws spring clips could be used.

Furthermore there is known from US 2006/0157102 A1 a system for utilizing waste heat, for instance from an internal combustion engine, which is provided with a central high-temperature heat exchanger with an internal lamellar structure in a flat assembly, thermoelectric modules being placed on both sides. The outer side of each thermoelectric module is in thermal contact with a low-temperature heat exchanger, which also has an internal lamellar structure. The hot exhaust gas in the high-temperature heat exchanger and the coolant in the low-temperature heat exchanger are fed through the thermo-electric generator unit in parallel but oppositely directed flows.

Figure 1:
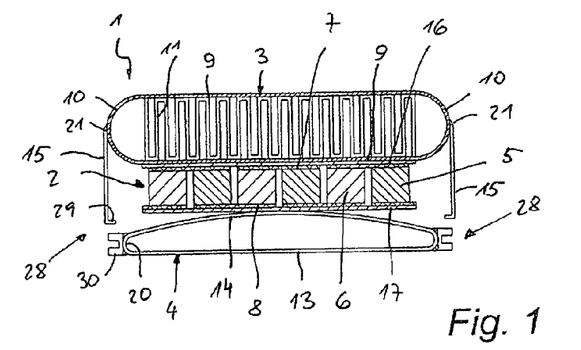

From JP 2007-221895 a thermoelectric generator unit shown in FIG. 1 is known, whose thermoelectric modules are in contact with an exhaust gas heat exchanger (high-temperature heat exchanger) on one side, and with a coolant heat exchanger (low-temperature heat exchanger) on the other side. The coolant heat exchanger and the exhaust gas heat exchanger are configured as flat ducts, such that the individual components may be stacked and thus manufactured in a space-saving design.

The whole assembly is held together by a plurality of two-part clamping elements, and to protect the TEG-modules from corrosion a heat-resistant waterproof frame is provided, which is inserted into opposing grooves of the exhaust gas- and coolant heat exchangers. Between the clamping elements and the heat exchangers lying on the outside of the unit spring elements configured as disk springs are provided, by which the pressing force may be adjusted.

From DE 15 39 330 A1 a thermoelectric generator unit is known whose thermoelectric modules are thermo-legs with electrical contact bridges, which on the hot side contact a large-volume heat exchanger pipe and on the cold side are in contact with a plurality of flat ducts distributed over the periphery. The flat ducts can be elastically deformed in the direction of the axis of the thermo-legs in order to compensate for manufacturing tolerances and changes in length due to the temperature differences arising. The flat ducts are attached on the central heat exchanger pipe by means of brackets and screws provided on both sides of the flat ducts.

It is an object of the present invention to propose a thermoelectric generator unit which is based on the energy generator devices described above and which exhibits great simplicity of design, permitting the individual structural elements of the generator unit to be uniformly and lastingly pressed against each other in a simple manner.

SUMMARY OF THE INVENTION

The invention achieves this object by proposing that side walls be attached to the lateral wall sections, at least of the two outer heat exchangers, which will sustain the clamping forces required for uniform and lasting pressing of the individual elements of the thermoelectric generator unit.

The invention also provides that the thermoelectric module be laterally sealed by the side walls sustaining the damping forces, these side walls simultaneously performing a stressing and sealing function and closing off the thermoelectric module smoothly and evenly against the outside. Together with the front and rear walls of the generator unit, the side walls will form an essentially enclosed inner space which contains and protects the thermoelectric module.

In order to be able to balance temperature-dependent stresses, especially during start-up or close-down of the thermoelectric generator unit, it is important to cushion the clamping forces elastically.

According to a first variant of the invention at least one spring element, for instance a corrugated spring element or a leaf spring element, is placed on at least one contact surface between the thermoelectric module and the exhaust gas heat exchanger or the coolant heat exchanger.

According to a second variant of the invention at least one of the flat sides of the exhaust gas heat exchanger or the coolant heat exchanger facing the thermoelectric module may be elastically prestressed in the direction towards the thermoelectric module. For instance, the elastically prestressed side may have an approximately cylindrical bulge in the direction of the thermoelectric module prior to assembly, which bulge is pressed flat in the assembled state and in this way will uniformly press together the TEG-elements.

The required shape of the approximately cylindrical (prismatic) wall prior to assembly may be determined in accordance with the bending theory of beams under uniformly distributed load and moderate torsional stiffness at the points of support, and should result in a pressure on the TEG-modules of between 0.1 N/mm$^2$ and 5 N/mm$^2$. The non-stressed shape may additionally be optimized by Finite Element Analysis of the TEG-module with the objective of uniform pressure exerted on all TEG-legs.

Finally, in a third variant of the invention the side walls of the thermoelectric generator unit may be configured as tension springs. It is also possible to simultaneously employ more than one of the described variants of exerting flexible pressure.

According to the present invention the side walls of the generator unit may be attached sealingly and force-locked to the lateral wall sections of the heat exchangers in a variety of ways, i.e., by welding, soldering or bonding, by riveting or screwing or by means of a snap-on connection.

BRIEF DESCRIPTION OF THE DRAWINGS

The invention will now be explained in more detail with reference to the enclosed drawings. There is shown in FIG. 1 a sectional view of a thermoelectric generator unit according to the invention in unassembled state.

DETAILED DISCUSSION OF THE DEPICTED EMBODIMENTS

Figure 2:
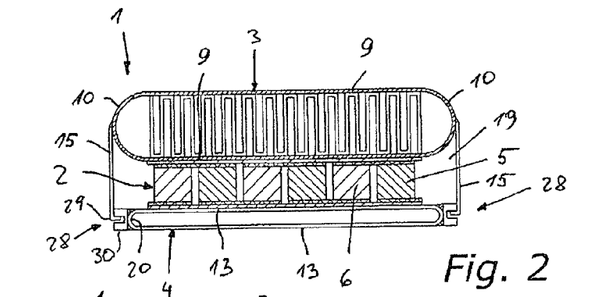
FIG. 2 the generator unit of FIG. 1 in an assembled state.

The thermoelectric generator unit 1 shown in FIGS. 1 and 2 has a thermoelectric module 2, which is in thermal contact on one side with a flat-duct exhaust gas heat exchanger 3 and on the other side with a flat-duct coolant heat exchanger 4.

The thermoelectric module 2 consists in a known way of n- and p-doped legs 5, 6 (N- and P-legs), which are provided with electrical contacts 7, 8 at their ends and form connected Peltier elements whose external leads are not shown here.

The exhaust gas heat exchanger 3 has opposing flat sides 9 connected by lateral wall sections 10, which may be rounded or curved, In the area of the opposing flat sides 9 lamellas 11 are disposed, preferably configured as a one-piece lamella train, which lamellas are essentially placed at a right angle to the flat sides 9 and serve to maximize heat transition from the gas while at the same time increasing the stiffness of the flat duct 3.

The coolant heat exchanger 4 has opposing flat sides 13 connected for instance by rounded lateral wall sections 20, the side facing the thermoelectric module 2 being elastically prestressed in the assembled state. As shown in FIG. 1, the side 13 of the flat duct 4 facing the thermoelectric module 2 has an approximately cylindrical (prismatic) bulge 14, which is pressed flat in the assembled state (see FIG. 2). The shape of the bulge 14 is optimized in such a way that in the assembled state uniform pressure is exerted on the N- and P-legs 5, 6.

Figure 3:
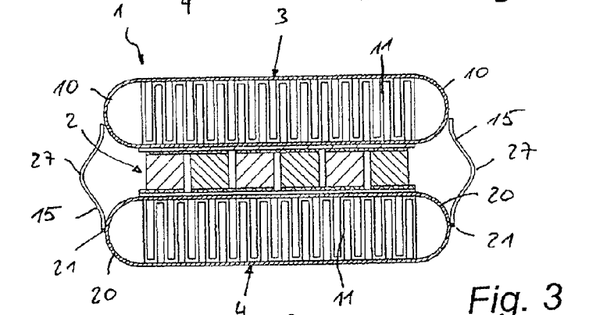
FIG. 3 and FIG. 4 a variant of the generator unit of the invention as shown in FIGS. 1 and 2 in the unassembled and assembled states, respectively.
Figure 4:
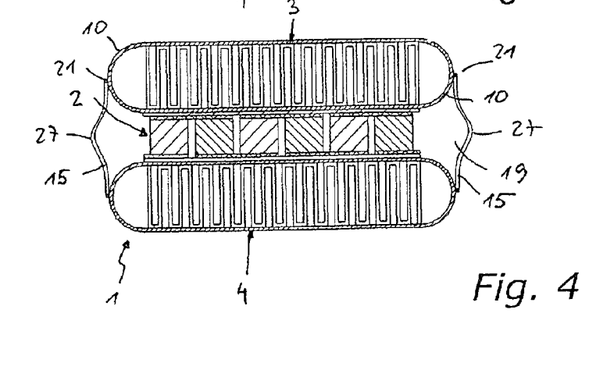

In the manufacturing process the entire structure as shown in FIG. 1 with the side walls 15 already welded in place (see the weld seam 21 in the curved wall area 10), is pressed together in a suitable apparatus until the ends of the side walls 15 reach the wall sections 20 of the coolant heat exchanger 4 and lock into a snap-on connection 28, which consists of a rib 29 on the side walls 15 and a grooved strip 30 attached to the wall section 20. The snap-on connection 28 may for instance be sealed by means of a sealant or a bonding agent. As shown in the variants of FIGS. 3 and 4 the side walls 15 may also be welded to both wall sections 10 and 20. This will result in a compact enclosed unit in which the thermoelectric module 2 is protected and which has plane exterior surfaces, permitting easy and space-saving installation in motor vehicles.

To reduce friction and improve the thermal contact between the exhaust gas heat exchanger 3 and the thermoelectric module 2, an anti-friction layer 16, for instance a carbon film or a MoS$_2$ coating, is provided. To further improve the thermal contact, a contact layer 17, for instance a Diamond-Like-Carbon (DLC) layer is disposed between the thermoelectric module 2 and the coolant heat exchanger 4.

In FIGS. 3 and 4 there is shown a variant of the invention in which the side walls 15 of the thermoelectric generator unit 1 are configured as tension springs 27. In the manufacturing process the whole structure as shown in FIG. 3, with the side walls 15 already welded in place (see weld seam 21 on the wall section 20) is pressed together in a suitable apparatus, until the ends of the side walls 15 lie against the wall sections 10 of the exhaust gas heat exchanger 3. Then a force-locking connection is established by a weld seam 21 on the wall section 10 (see FIG. 4), thus connecting the flat-duct coolant heat exchanger 4 in its assembled state with the flat-duct exhaust gas heat exchanger 3 via the tightly welded side walls 15. Both heat exchangers 3, 4 are designed to resist bending and contain a lamella train 11.

Figure 5:
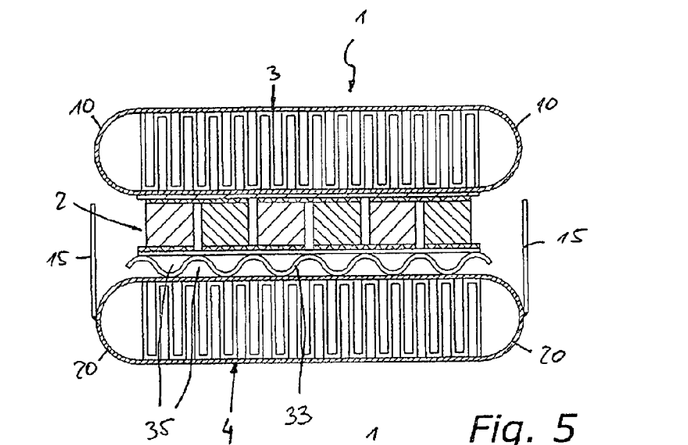
FIG. 5 to FIG. 7 further variants of the thermoelectric generator unit of the invention in an unassembled state in a sectional view as in FIG. 1.
Figure 6:
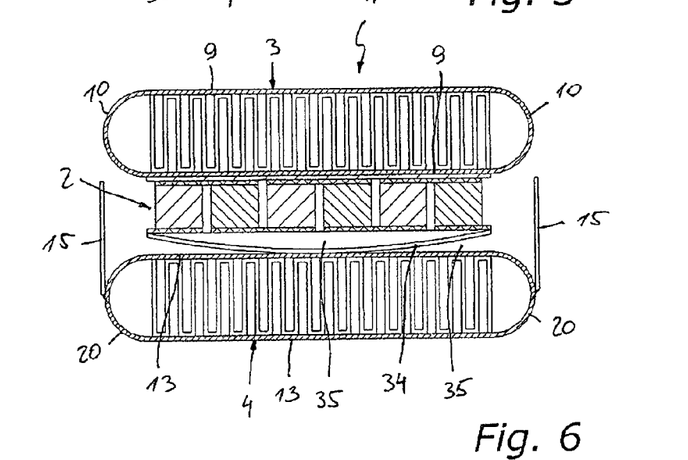
Figure 7:
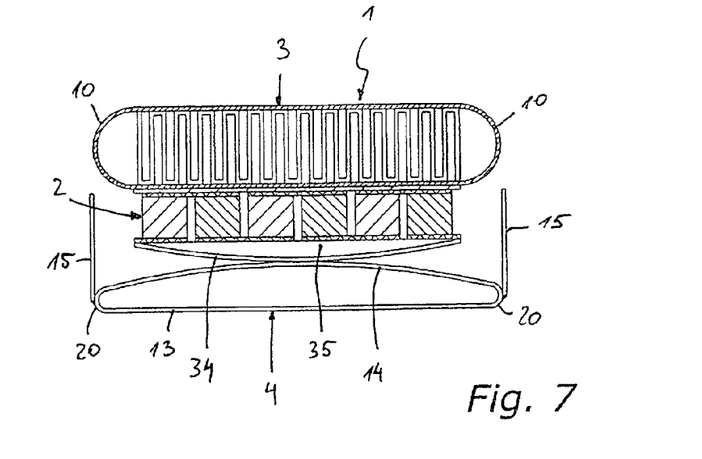

In the variants of FIGS. 5, 6, 7 only the non-assembled state is shown for better presentation of the individual spring elements in their load-free state. The side walls 15 welded to lateral wall section 20 of the coolant heat exchanger 4 must be attached, e.g. welded, to the lateral wall sections 10 of the exhaust gas heat exchanger 3 after the generator unit 1 has been pressed together.

In the variants of FIGS. 5 and 6 a spring element, for instance a corrugated spring element 33 (FIG. 5) or a leaf spring element 34 (FIG. 6), is placed on a contact surface between the thermoelectric module 2 and the coolant heat exchanger 4. To improve heat transfer an elastic heat conducting material, preferably a heat conducting paste, may be introduced into the empty spaces 35 remaining after the spring elements 33, 34 have been subjected to pressure.

In the variant shown in FIG. 7 two different spring elements are used simultaneously. On the one hand the coolant heat exchanger 4 has a spring bulge 14 and on the other hand a leaf spring element 34 is additionally placed between the coolant heat exchanger 4 and the thermoelectric module 2.

Figure 8:
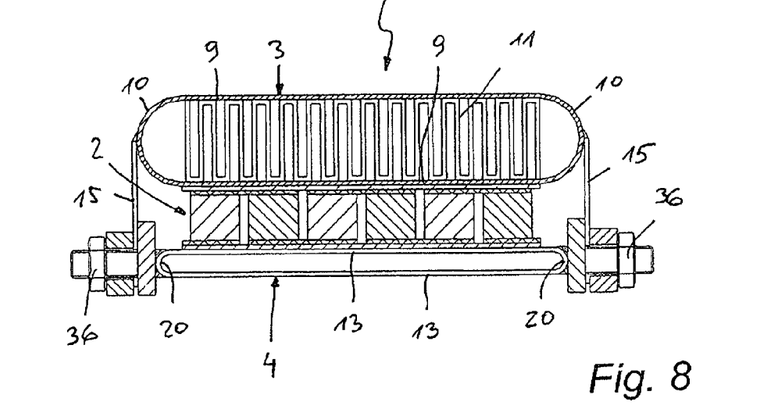
FIG. 8 a variant of the generator unit of the invention in an assembled state in a sectional view as in FIG. 2.

In the variant of FIG. 8 only the assembled state is shown in which the approximately cylindrical (prismatic) bulge of the flat-duct coolant heat exchanger 4 (see FIG. 1) is already flattened by pressing, resulting in parallel flat sides 13. The side walls 15 are here attached to the lateral wall sections 20 of the coolant heat exchanger 4 by means of a screw connection 36 and are welded to the exhaust gas heat exchanger 3. The screw connections 36 could of course also be located on the side of the exhaust gas heat exchanger 3.

Figure 9:
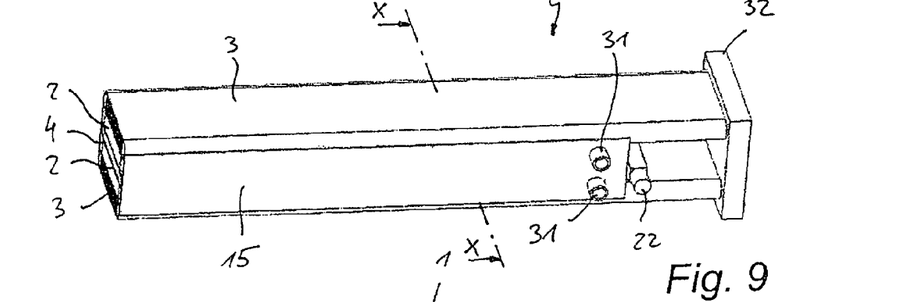
FIG. 9 a three-dimensional partial view of a thermoelectric generator unit according to the invention.
Figure 10:
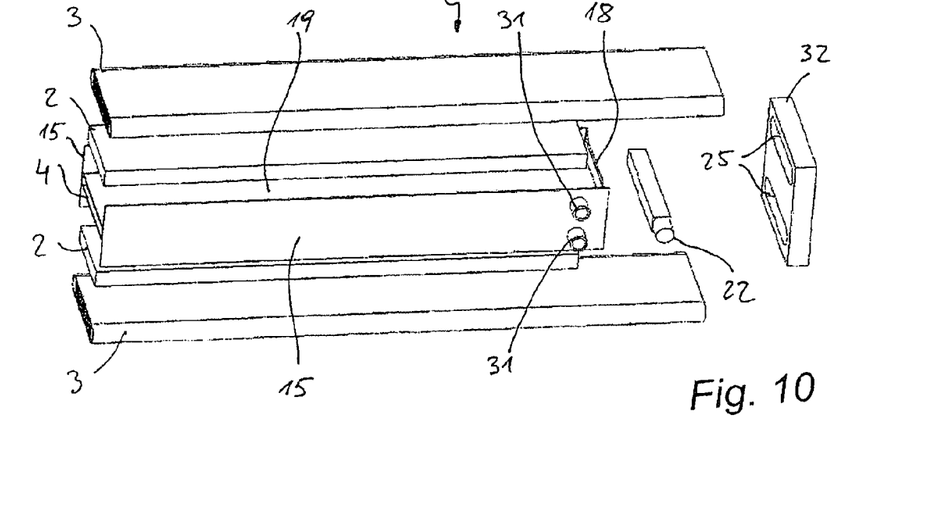
FIG. 10 an exploded view of the generator unit of FIG. 9.

In the variant of the thermoelectric generator unit 1 (cut off on the left side) shown in FIGS. 9 and 10, a thermoelectric module 2 is placed on each side of the flat-duct coolant heat exchanger 4 and is in thermal contact with an exhaust gas heat exchanger 3. The side walls 15 with openings 31 for electrical leads cover both thermoelectric modules 2. By the side walls 15, which are tightly attached to the exhaust gas heat exchangers 3, and the front and rear walls 18 of the generator (see FIG. 10) an enclosed inner space 19 is formed, which contains and protects the one or more thermoelectric modules 2. The cooling water intake plus distributor channel is indicated by 22, the water outlet lying opposite is not shown. In a mounting flange 32 gas intake openings 25 for the two exhaust gas heat exchangers 3 can be seen.

Figure 11:
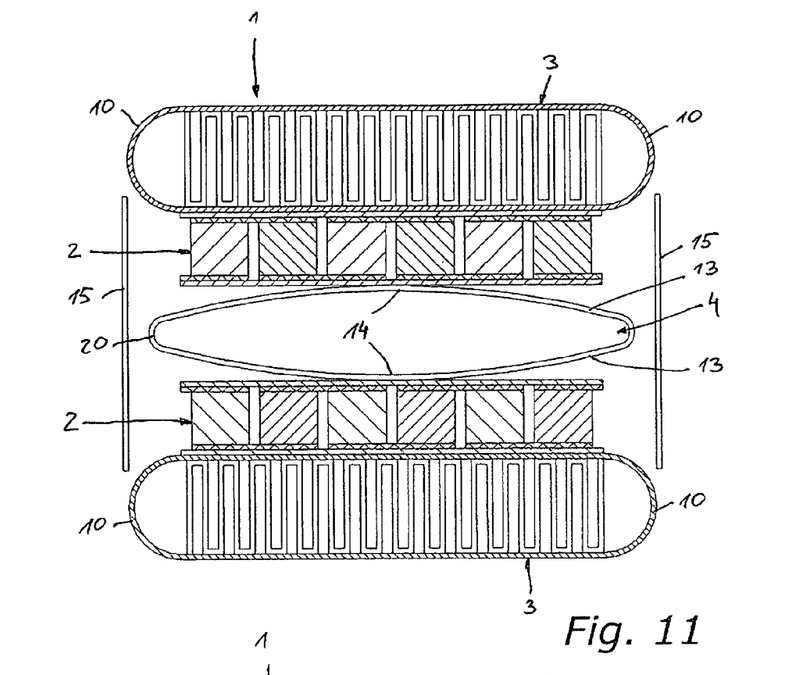
FIG. 11 and FIG. 12 an enlarged section of the generator unit along line X - X of FIG. 9 in unassembled and assembled states, respectively.
Figure 12:
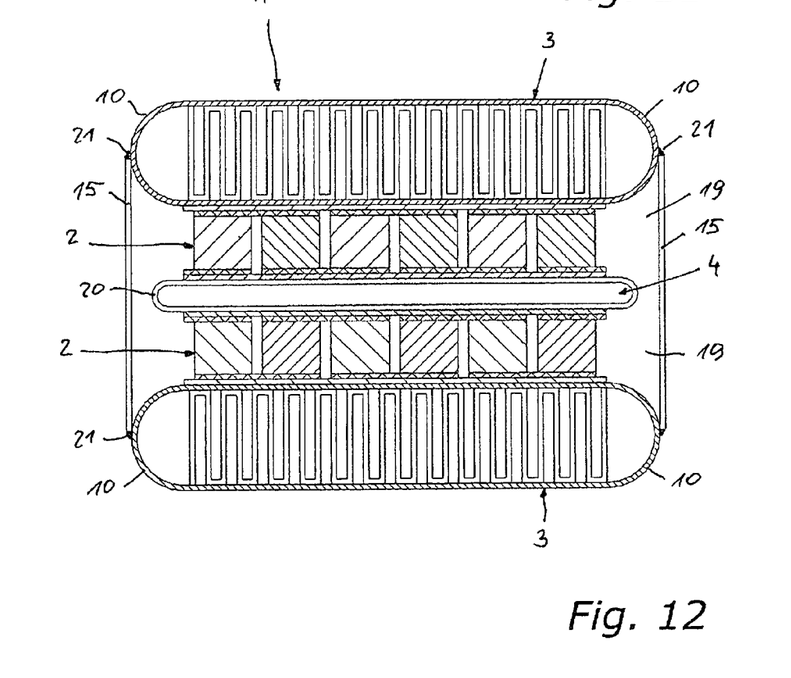

As can be observed in the enlarged sectional drawing, both walls 13 of the coolant heat exchanger 4 are elastically prestressed and each has a convex bulge 14 contacting a thermoelectric module 2 (see FIG. 11). After assembly and welding of the side walls 15 to the wall sections 10 of the exhaust gas heat exchangers 3 located on both sides, a compact unit is formed (see FIG. 12) whose remaining empty inner spaces 19 may be foam-filled. Due to thermal decoupling of the side walls 15 from the coolant heat exchanger 4, these side walls are largely isothermal. This variant with two exhaust gas heat exchangers 3 exhibits minimized heat transfer resistance on the gas side and may be employed to particular advantage in diesel engines in the area of the exhaust gas recirculation system and in the exhaust gas area.

Figure 13:
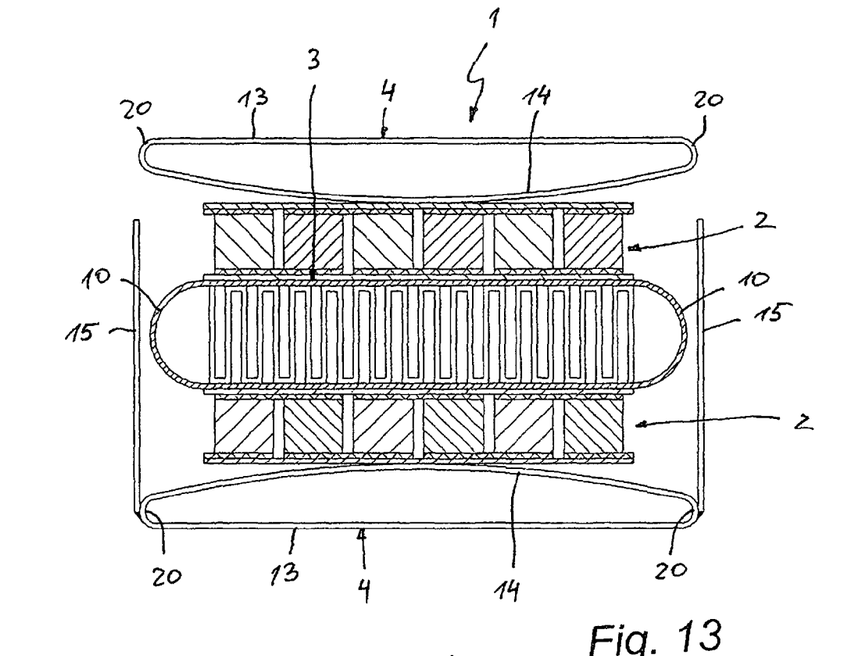
FIG. 13 and FIG. 14 a sectional view of a thermoelectric generator unit according to the invention, comprising one exhaust gas heat exchanger and two coolant heat exchangers in unassembled and assembled states.
Figure 14:
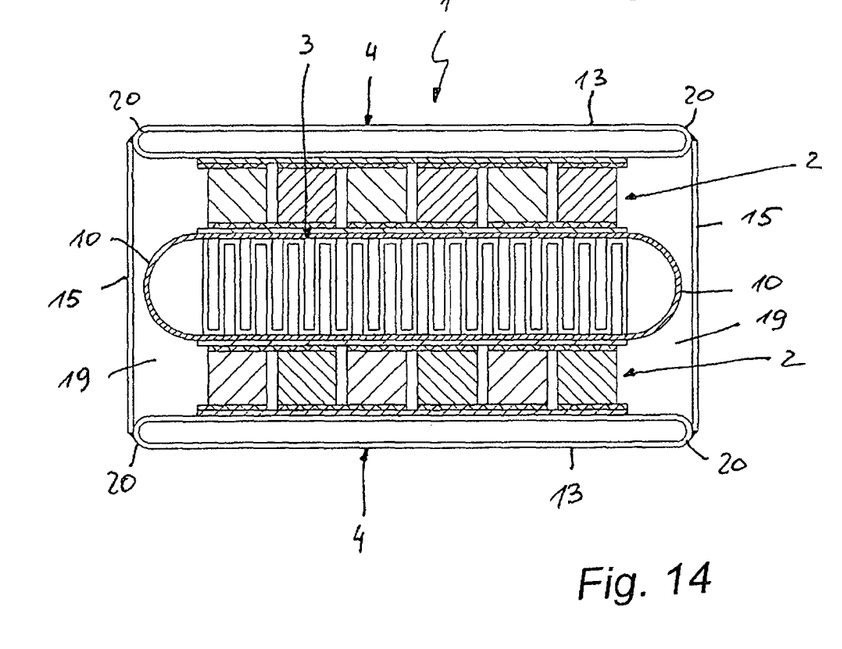

In FIGS. 13 and 14 a variant is shown in which the side walls 15 form a positive-locking connection between the lateral wall sections 20 of two coolant heat exchangers 4, which are positioned on both sides of an exhaust gas heat exchanger 3, a thermoelectric module 2 being interposed on each side. The lateral wall sections 10 of the exhaust gas heat exchanger 3 are thermally decoupled from the side walls 15. As a result, heat loss via the largely isothermal side walls 15 is minimized.

Figures 15, 16, 17:
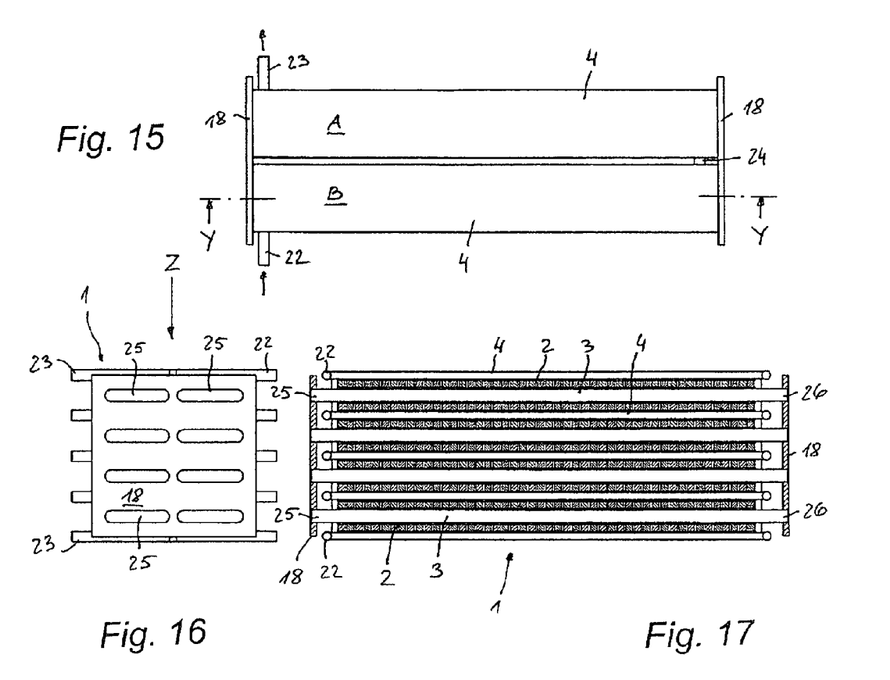
FIG. 15 a further variant of the thermoelectric generator unit of the invention in a view from above.
FIG. 16 a frontal view of the generator unit of FIG. 15.
FIG. 17 a section along line Y - Y of FIG. 15 of the generator unit.

In FIGS. 15 to 17 there is finally shown a high-power variant in which a plurality of thermoelectric modules 2, each adjacent to an exhaust gas heat exchanger 3 and a coolant heat exchanger 4, are assembled sandwich-like in two stacks A and B to make up a thermoelectric generator unit 1.

FIG. 15 shows a view from above, as indicated by arrow Z in FIG. 16, FIG. 16 is a front view and FIG. 17 a sectional view. The generator unit 1 has a front and a rear wall 18, in which there are eight gas inlet and outlet openings 25, 26, which are flow-connected to the eight exhaust gas heat exchangers 3. The corresponding coolant heat exchangers 4 each have a lateral cooling water inlet 22 and cooling water outlet 23, with cooling water transfer ducts 24 provided between stacks A and B.

The flat ducts of the exhaust gas heat exchangers 3 and the coolant heat exchangers 4 are positioned parallel to each other in order to realize counterflow or uniflow heat exchangers 4.

Due to the encapsulated variants of the generator units of the invention, corrosion damage will largely be avoided. The closed interior space 19 may be foam-filled to minimize convective heat conduction, using a high-temperature foam, for instance a ceramic foam. This will result in a compact generator unit 1 with smooth, plane surfaces on all sides.

The invention claimed is:

1. A thermoelectric generator unit which comprises:
   an exhaust gas heat exchanger, said exhaust gas heat exchanger including first and second flat side walls having corresponding first and second ends, and first and second lateral walls, said first lateral wall extending between said first ends of said first and second flat side walls and said second lateral wall extending between said second ends of said first and second side walls to define a generally flat first duct,
   a coolant heat exchanger, said coolant heat exchanger including third and fourth flat side walls having corresponding first and second ends, and third and fourth lateral walls, said third lateral wall extending between said first ends of said third and fourth flat side walls and said fourth lateral wall extending between second ends of said third and fourth flat side walls to define a generally flat second duct,
   said first and second generally flat ducts extending parallel to each other,
   a thermoelectric module having opposite first and second surfaces positioned between said exhaust gas and coolant heat exchangers, said thermoelectric module including a series of p- and n- doped legs, and
   a first side wall which is directly attached to and between said first lateral wall of said exhaust gas heat exchanger and said third lateral wall of said coolant heat exchanger, and a second side wall which is directly attached to and between said second lateral wall of said exhaust gas heat exchanger and said fourth lateral wall of said coolant heat exchanger to clamp together said first duct, said thermoelectric module and said second duct and thereby form a compressed sandwiched unit.

2. The thermoelectric generator unit according to claim 1, including rivets or screws to attach the first and second side walls to the respective lateral wall sections of the exhaust gas heat exchanger and/or the coolant heat exchanger.

3. The thermoelectric generator unit according to claim 1, including a snap-on connection to attach the first and second side walls to the respective lateral wall sections of the exhaust gas heat exchanger and/or the coolant heat exchanger.

4. The thermoelectric generator unit according to claim 1, wherein said first side wall and said second side wall are directly attached to said first lateral wall and said second lateral wall, respectively, by welding, soldering or bonding.

5. The thermoelectric generator unit according to claim 4, wherein said first side wall and said second side wall are directly attached to said third lateral wall and said fourth lateral wall, respectively, by welding, soldering or bonding.

6. The thermoelectric generator unit according to claim 1, including an antifriction layer between said first surface of said thermoelectric module and said exhaust gas heat exchanger.

7. The thermoelectric generator unit according to claim 1, including a corrugated spring element positioned between said second surface of said thermoelectric module and said coolant heat exchanger.

8. The thermoelectric generator unit according to claim 1, including a leaf spring element between said second surface of said thermoelectric module and said coolant heat exchanger.

9. A thermoelectric generator unit which comprises:
a first exhaust gas heat exchanger, said first exhaust gas heat exchanger including first and second flat side walls having corresponding first and second ends, and first and second lateral walls, said first lateral wall extending between said first ends of said first and second flat side walls and said second lateral wall extending between said second ends of said first and second side walls to define a generally flat first duct,
a second exhaust gas heat exchanger, said second exhaust gas heat exchanger including third and fourth flat side walls having corresponding first and second ends, and third and fourth lateral walls, said third lateral wall extending between said first ends of said third and fourth flat side walls and said fourth lateral wall extending between second ends of said third and fourth flat side walls to define a generally flat second duct,
first and second thermoelectric modules positioned between said first and second exhaust gas heat exchangers, each of said first and second thermoelectric modules having opposite first and second surfaces and a series of p- and n- doped legs,
a coolant heat exchanger positioned between said first and second thermoelectric modules,
said first and second exhaust gas heat exchangers and said coolant heat exchanger extending parallel to each other, and
a first side wall which is directly attached to and between said first lateral wall of said first exhaust gas heat exchanger and said third lateral wall of said second exhaust gas heat exchanger, and a second side wall which is directly attached to and between second lateral wall of said first exhaust gas heat exchanger and said fourth lateral wall of said second exhaust gas heat exchanger to clamp together said first exhaust gas heat exchanger, said first thermoelectric module, said coolant heat exchanger, said second thermoelectric module and said second exhaust gas heat exchanger to thereby form a compressed sandwiched unit.

10. A thermoelectric generator unit which comprises:
a first coolant heat exchanger, said first coolant heat exchanger including first and second flat side walls having corresponding first and second ends, and first and second lateral walls, said first lateral wall extending between said first ends of said first and second flat side walls and said second lateral wall extending between said second ends of said first and second walls to define a generally flat first duct,
a second coolant heat exchanger, said second coolant heat exchanger including third and fourth flat side walls having corresponding first and second ends, and third and fourth lateral walls, said third lateral wall extending between said first ends of said third and fourth flat side walls and said fourth lateral wall extending between second ends of said third and fourth flat side walls to define a generally flat second duct,
first and second thermoelectric modules positioned between said first and second coolant heat exchangers, each of said first and second thermoelectric modules having opposite first and second surfaces and including a series of p- and n- doped legs,
an exhaust gas heat exchanger positioned between said first and second thermoelectric modules,
said first and second coolant heat exchangers and said exhaust gas heat exchanger extending parallel to each other, and
a first side wall which is directly attached to and between said first lateral wall of said first coolant heat exchanger and said third lateral wall of said second coolant heat exchanger, and a second side wall which is directly attached to and between said second lateral wall of said first coolant heat exchanger and said fourth lateral wall of said second coolant heat exchanger to clamp together said first coolant heat exchanger, said first thermoelectric module, said exhaust gas heat exchanger, said second thermoelectric module and said second coolant heat exchanger to thereby form a compressed sandwiched unit.

11. A thermoelectric generator stack which comprises a plurality of thermoelectric generator units according to claim 1.

* * * * *

UNITED STATES PATENT AND TRADEMARK OFFICE
CERTIFICATE OF CORRECTION

Page 1 of 1

PATENT NO. : 9,466,778 B2
APPLICATION NO. : 13/138710
DATED : October 11, 2016
INVENTOR(S) : Salzgeber It is certified that error appears in the above-identified patent and that said Letters Patent is hereby corrected as shown below:

TITLE PAGE

(73)   Assignee should read:   AVL List GmbH, Graz (AT)

Signed and Sealed this
Sixth Day of December, 2016

Michelle K. Lee
*Director of the United States Patent and Trademark Office*